(12) United States Patent
Scollo et al.

(10) Patent No.: US 7,701,279 B2
(45) Date of Patent: Apr. 20, 2010

(54) DRIVING CIRCUIT FOR AN EMITTER-SWITCHING CONFIGURATION

(75) Inventors: Rosario Scollo, Misterbianco (IT); Massimo Nania, Gravina di Catania (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 12 days.

(21) Appl. No.: 11/906,368

(22) Filed: Oct. 1, 2007

(65) Prior Publication Data
US 2008/0094120 A1 Apr. 24, 2008

Related U.S. Application Data

(63) Continuation-in-part of application No. PCT/IT2005/000732, filed on Dec. 13, 2005.

(51) Int. Cl.
*H03K 17/60* (2006.01)
(52) U.S. Cl. ...................... 327/433; 327/434
(58) Field of Classification Search ............... 327/427, 327/430–434, 436, 437, 374–377
See application file for complete search history.

(56) References Cited

U.S. PATENT DOCUMENTS

| | | | | | |
|---|---|---|---|---|---|
| 4,547,686 | A | * | 10/1985 | Chen | 327/374 |
| 4,740,722 | A | * | 4/1988 | Furuhata | 327/432 |
| 4,866,313 | A | * | 9/1989 | Tabata et al. | 327/432 |
| 5,793,551 | A | * | 8/1998 | Ngo et al. | 360/67 |
| 6,091,276 | A | * | 7/2000 | Aiello et al. | 327/376 |
| 6,255,890 | B1 | * | 7/2001 | Aiello et al. | 327/432 |
| 6,373,318 | B1 | * | 4/2002 | Dohnke et al. | 327/427 |
| 7,023,246 | B2 | * | 4/2006 | Scollo et al. | 327/108 |
| 7,053,678 | B2 | * | 5/2006 | Scollo et al. | 327/108 |
| 7,218,164 | B2 | * | 5/2007 | Vitale et al. | 327/376 |
| 7,449,935 | B2 | * | 11/2008 | Scollo et al. | 327/374 |

FOREIGN PATENT DOCUMENTS

EP 1 455 452 A 9/2004

OTHER PUBLICATIONS

International Search Report for PCT/IT2005/000732 dated Mar. 31, 2006.

* cited by examiner

*Primary Examiner*—Lincoln Donovan
*Assistant Examiner*—Hai L. Nguyen
(74) *Attorney, Agent, or Firm*—Kevin D. Jablonski; Graybeal Jackson LLP

(57) ABSTRACT

An embodiment of the invention relates to a driving circuit for an emitter-switching configuration of transistors having at least one first and one second control terminal connected to the driving circuit to form a controlled emitter-switching device having in turn respective collector, source and gate terminals. Advantageously the driving circuit comprises at least one IGBT device inserted between the collector terminal and a first end of a capacitor, whose second end is connected to the first control terminal, the IGBT device having in turn a third control terminal connected, through a first resistive element, to the gate terminal, as well as a second resistive element inserted between the gate terminal and the second control terminal. Advantageously, the driving circuit further comprises an additional supply inserted between the first and second ends of the capacitor to ensure its correct biasing.

17 Claims, 7 Drawing Sheets f1: Vgs = 14V
f2: Vgs = 12V
f3: Vgs = 10V
f4: Vgs = 8V
f5: Vgs = 6V f1: Vgs = 14V
f2: Vgs = 12V
f3: Vgs = 10V
f4: Vgs = 8V
f5: Vgs = 6V

DRIVING CIRCUIT FOR AN EMITTER-SWITCHING CONFIGURATION

PRIORITY CLAIM

This is a continuation-in-part application which claims priority from PCT/IT2005/000732, published in English, filed Dec. 13, 2005, which is incorporated herein by reference.

TECHNICAL FIELD

An embodiment of the present invention relates to a driving circuit for an emitter-switching configuration comprising bipolar and MOS transistors and having at least one first and one second control terminal connected to the driving circuit to form a device of the controlled emitter-switching type having in turn respective collector, source and gate terminals.

BACKGROUND

A so called emitter-switching circuit configuration comprises a connection of a bipolar transistor having a high breakdown voltage and a power MOSFET transistor with low voltage.

Such a configuration is schematically shown in FIG. 1 and globally indicated at 1. The emitter-switching configuration 1 comprises a bipolar transistor T1 and a MOS transistor M1 inserted, in series to each other, between a first and a second voltage reference, in particular the supply voltage Vcc and the ground GND.

The emitter-switching configuration 1 provides that the bipolar transistor T1 is of the HV (High Voltage) type, i.e. a transistor having a high breakdown voltage, while the MOS transistor M1 is of the LV (Low Voltage) type, i.e. a transistor having a low breakdown voltage.

The bipolar transistor T1 has a collector terminal connected to the supply voltage reference Vcc through an inductive load L1 and a control or base terminal connected to a driving circuit 2.

The MOS transistor M1 has in turn a control or gate terminal connected to the driving circuit 2.

The driving circuit 2 comprises:
- a first resistive element RB connected to the base terminal of the bipolar transistor T1 and, through a Zener diode DZ, to the ground GND;
- a second resistive element RG connected to the gate terminal of the MOS transistor M1 and, through a generator of voltage pulses G1, to the ground GND; and
- an electrolytic capacitor CB connected, in parallel, to the Zener diode DZ and having, at its ends, a voltage value equal to VB.

In particular, the electrolytic capacitor CB has the task of storing energy during the turn-off of the bipolar transistor T1, to use it again during a successive turn-on and conduction step of the transistor itself, while the Zener diode prevents the value of the base voltage of the bipolar transistor T1 from exceeding a determined threshold.

The set of the emitter-switching configuration 1 and of the driving circuit 2 forms a device of the controlled emitter-switching type 5.

The emitter-switching configuration, known to the skilled person in the field for a long time, is currently particularly interesting due to the presence on the market of bipolar transistors having a squared RBSOA [Reverse Biased Safe Operating Area] (in emitter-switching configuration) at a current next to the peak one and at a voltage equal to the breakdown voltage BVCES [Breakdown Voltage Collector-Emitter Short], the voltage between the collector and emitter terminals when the base terminal is short-circuited with the emitter terminal, as well as of power MOS transistors having a very low drain-source resistance value when conductive [ON condition], RDSON, and therefore almost assimilable to ideal switches.

Advantages of the emitter-switching configuration are a very low voltage drop in conduction (typical of bipolar transistors) and a high turn-off speed.

During the turn-off, in fact, the current outgoing from the base terminal of the bipolar transistor of the emitter-switching configuration is equal to the current of the collector terminal of this transistor, i.e. a current having a very high value. This determines a drastic reduction both of the storage time and of the fall time, allowing the emitter-switching configuration to work also up to frequencies of 150 kHz.

The driving carried out by means of the driving circuit 2 is very useful and efficient in all those cases wherein the current in the emitter-switching configuration 1 is null, or very small with respect to the nominal one, in the turn-on phase.

In order for this driving to be efficient it is, however, often necessary that the value of the base current during the turn-off phase, IBOFF, multiplied by the storage time, tstorage, is next to the value of the base current in the conduction phase, IBON, multiplied by the turn-on time, ton, i.e.:

$$IBOFF * tstorage \gg IBON * tON \tag{1}$$

The condition (1) usually occurs when working at relatively high frequencies and with not too high currents, or better when the gain value Hfe of the bipolar transistor is not too low.

In fact, in this case, the driving energy necessary for the conduction is only a little higher with respect to the one recovered during the turn-off phase. It is thus enough to supply the base terminal with a very little power for replacing the unavoidable losses.

FIG. 2 shows the pattern of the values of the voltage VGS between gate and source terminals of the MOS transistor M1, of the voltage between the collector terminal of the bipolar transistor T1 and the source terminal of the MOS transistor M1, VCS, and of the base and collector currents of the bipolar transistor T1 with reference to a flyback converter working at a frequency of 100 kHz and having a null turn-on current since the converter works in a discontinuous way.

When working with applications wherein the value of the current on the device at the turn-on is not null, and at relatively high frequencies (>60 kHz), having to deal with a bipolar device, the phenomenon of the dynamic $V_{CESAT}$ is highlighted. This phenomenon is that, at the turn-on, there exists a certain delay before reaching the value of static voltage VCESAT, it is thus necessary to flood by carriers the base region of the bipolar transistor as quickly as possible to make the value of the voltage VCESAT decrease and to reach the steady value as soon as possible.

For this reason, with the driving circuit 2 of FIG. 1, an excessive dissipation at the turn-ON would be obtained due to the fact that the voltage drop $V_{CE}$ would take a relatively long time ($\cong 2$ μs) to reach the saturation value.

Always with reference to the controlled emitter-switching device 5 of FIG. 1, an increase of the VB would only partially reduce the problem of the dynamic VCESAT but it would enormously worsen the performances at the turn-off.

The driving circuit suitable for the applications with non-null collector current at the turn-on has been object of the European patent application No. 03425140.5 (which is incorporated by reference) and it is schematically shown in the annexed FIG. 3, globally indicated at 12. The driving circuit 12 is suitably connected to an emitter-switching configuration 1 to form a device of the controlled emitter-switching type 15.

The driving circuit 12 suitably modulates the base current optimizing both the switch steps and allowing the attainment of the minimum value of $V_{CESAT}$ in the shortest time possible. In the annexed FIG. 4, the waveforms are reported which refer to a converter of the forward type working at a frequency of 110 kHz, where the modulation of the base current can be observed.

The detailed operation and the sizing of the driving circuit 12 are widely discussed in the cited patent application.

Although advantageous under several points of view, this known driving circuit has admitted drawbacks mainly highlighted when the need of applications with collector currents of variable value in a wide range is to be faced.

In these applications, the driving circuit 12, as described in the above indicated European patent application, is in fact sized taking into account the most stressing working condition, i.e. the highest collector current.

Thus a correct saturation level should be ensured for the highest current value, by suitably choosing a base voltage value Vb' of the bipolar transistor T1, but in so doing, for low collector current values, the device works in over-saturation conditions, obtaining extremely long storage times.

This implies an excessive dissipation at the turn-off, as well as inaccurate control due to the fact that the effective turn-off of the device occurs with delay with respect to the signal supplied by a controller.

It is also possible to use more complex solutions comprising additional circuitries for the control of the storage time, tstorage, through a modulation of the base current.

In this case, however, specific designs of the base driving circuit are to be provided. The circuits thus obtained become difficult to be used with high currents values and they may not allow the connection of a recirculation diode between the collector and source terminals in half-bridge and complete bridge configurations.

In fact, the inductive recirculation current of interest in this case flows in a base loop through a supply capacity, discharging it and flowing then in the base-collector junction instead of flowing in the recirculation diode having the anode connected to the source terminal and the cathode to the collector terminal.

SUMMARY

An embodiment of the present invention provides a driving circuit of an emitter-switching configuration to control the saturation level in applications which have collector currents being variable in a wide range, able to meet the above-described need, i.e. the one of having a saturation level being suitable under any operation condition, simultaneously overcoming, in a simple and efficient way, all the drawbacks cited with reference to the prior art.

An embodiment of the present invention uses a connection of the Darlington type between an IGBT device of the high voltage type and the emitter-switching configuration, suitably changed to exploit the properties of almost saturation of the bipolar transistor of the emitter-switching configuration, ensuring in this way a low voltage drop in conduction conditions as well as a recovery, at least partial, of the base energy during the turn-off periods.

BRIEF DESCRIPTION OF THE DRAWINGS

Characteristics and advantages of the driving circuit according to one or more embodiments of the present invention will be better apparent from the following description of an embodiment thereof made with reference to the annexed drawings given by way of indicative and non limiting example.

DETAILED DESCRIPTION

Figure 1:
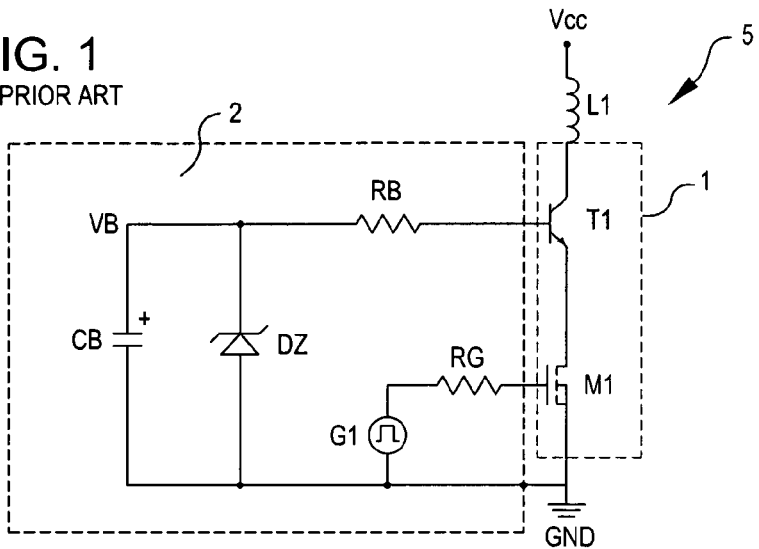
FIG. 1 shows a first driving circuit for an emitter-switching configuration realized according to the prior art.
Figure 2:
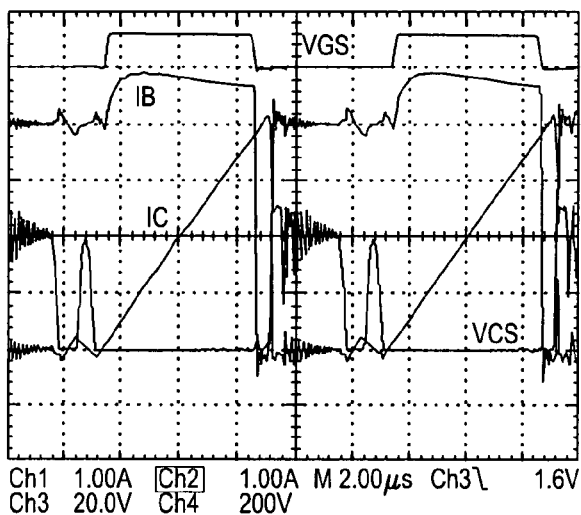
FIG. 2 shows the pattern of characteristic waveforms of a flyback converter of the discontinuous type comprising the known driving circuit shown in FIG. 1.
Figure 3:
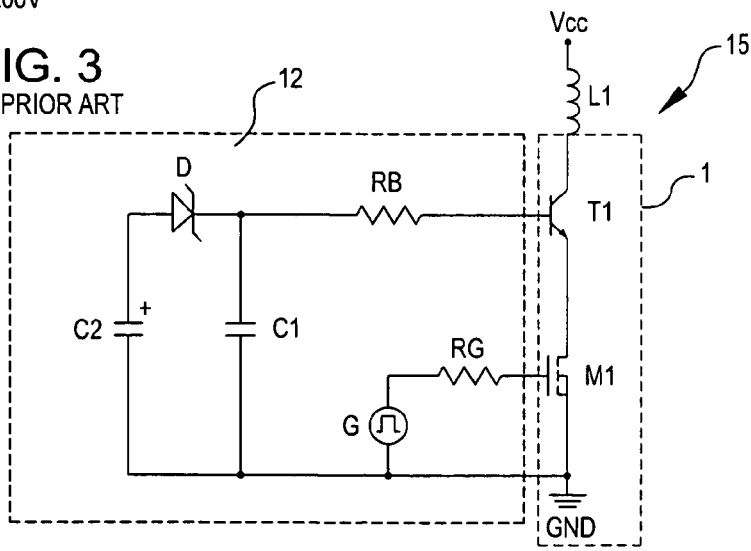
FIG. 3 schematically shows a second driving circuit for an emitter-switching configuration realized according to the prior art.
Figure 4:
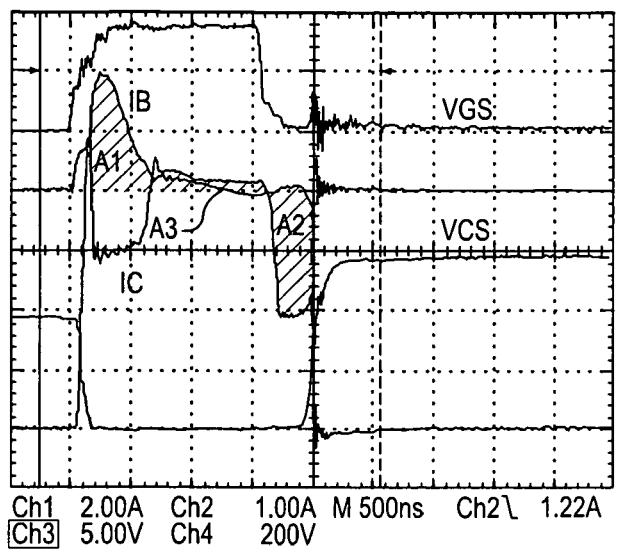
FIG. 4 shows waveforms obtained with the known driving circuit shown in FIG. 3.
Figure 5A:
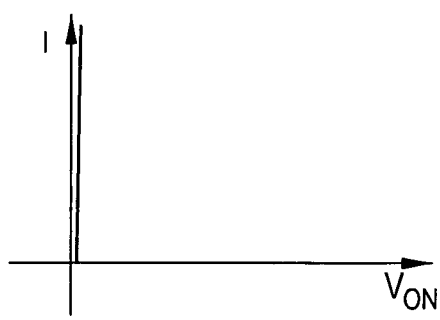
FIG. 5A shows a driving ideal current-voltage characteristic [I-V] of an emitter-switching configuration.

An embodiment of the present invention starts from the consideration that in a connection of the Darlington type, the driving circuit for an emitter-switching configuration may ideally have a current-voltage characteristic [I-V] of the type represented in FIG. 5A.

Figure 5B:
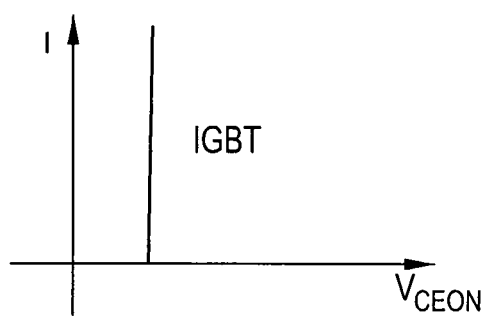
FIGS. 5B-5C show the pattern of the current-voltage characteristics [I-V] of known electronic components, respectively IGBT and MOS.
Figure 5C:
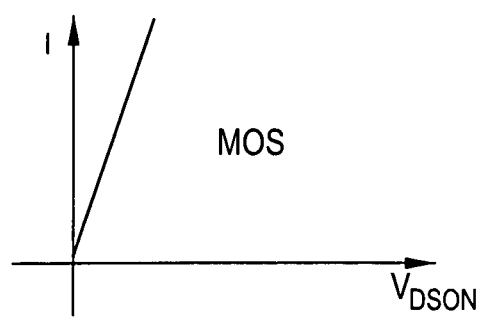

From a comparison of this ideal characteristic with the real characteristics I-V of an IGBT device and of a high voltage MOS device, represented in FIGS. 5B and 5C, respectively, one can see that these devices cannot meet an ideal required driving conditions.

In particular, the voltage drop in conduction of an IGBT device is in any case often too high to obtain the desired driving characteristic.

Similarly, by using a high voltage MOS device, it can be verified that it is often necessary to resort to elements with sizes on the silicon being more than ten times greater than the silicon area necessary for the realization of the emitter-switching configuration itself.

It is however interesting to note that the differential resistance value reached in conduction by an IGBT device having sizes equal to ⅓ of the emitter-switching configuration coincides with the desired value of the driving device total resistance.

Figure 6:
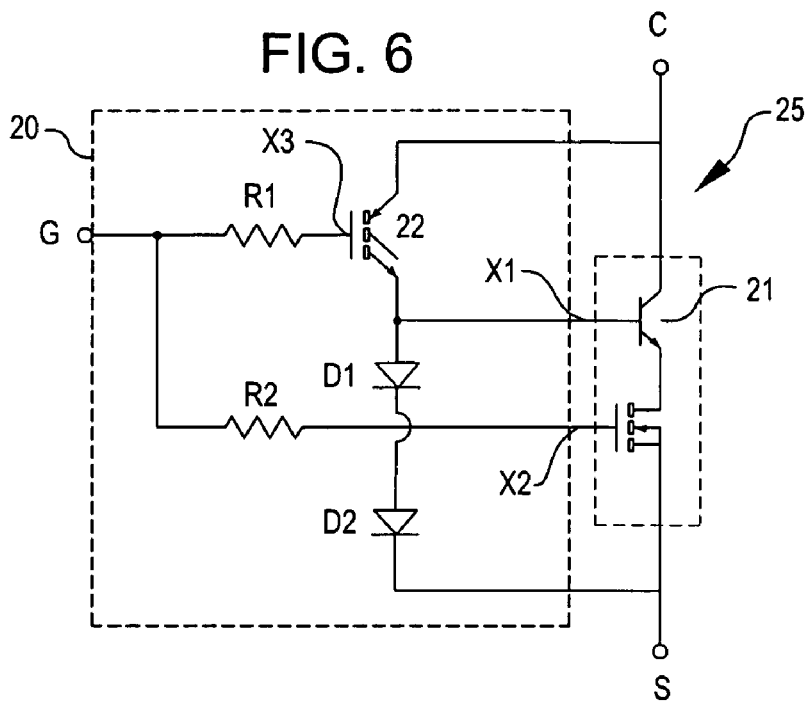
FIG. 6 schematically shows a driving circuit for an emitter-switching configuration realized according to a Darlington connection.

Starting from these considerations, it is possible to consider a driving circuit 20 for an emitter-switching configuration 21 comprising an IGBT device 22 as driver in a connection of the Darlington type with the emitter-switching configuration 21, as final, as shown in FIG. 6. In particular, the driving circuit 20 and the emitter-switching configuration 21 are connected to each other so as to realize a device of the controlled emitter-switching type 25 having a collector terminal C, a source terminal S and a gate terminal G.

The emitter-switching configuration 21 comprises a cascode connection of a bipolar transistor having a high breakdown voltage and of a low voltage power MOSFET transistor and it is inserted between the collector terminal C and the source terminal S. It also has a first X1 and a second control terminal X2, corresponding to the control terminals of the bipolar and MOSFET transistors, respectively, and connected to the driving circuit 20.

The driving circuit 20 comprises the IGBT device 22 inserted between the collector terminal C and the first control terminal X1 of the emitter-switching configuration 21 and having in turn a third control terminal X3 connected, through a first resistive element R1, to the gate terminal G.

The driving circuit 20 also comprises a second resistive element R2 inserted between the gate terminal G and the second control terminal X2.

Finally, the driving circuit 20 comprises the series of a first diode D1 and of a second diode D2 inserted between the first control terminal X1 and the source terminal S.

In essence, the driving circuit 20 comprises a Darlington connection of the IGBT device 22, as driver and the emitter-switching configuration 21, as final. It is also possible to consider a high voltage MOS transistor in place of the IGBT device 22.

This driving circuit 20 thus has a very simple structure which shows several advantages among which:
    driving easiness;
    it is MOSFET and IGBT compatible
    it allows the connection of a recirculation diode.

Unfortunately, the driving circuit 20 shown in FIG. 6 has however several disadvantages due to the Darlington connection itself, among which:
    the base-collector junction of the bipolar transistor of the emitter-switching configuration 21 is inversely biased and this transistor is thus desaturated;
    it has a high voltage drop in conduction;
    it has a drastic reduction of the inverted security area RBSOA;
    it does not allow any recovery of the base energy in switch-off condition.

Figure 7:
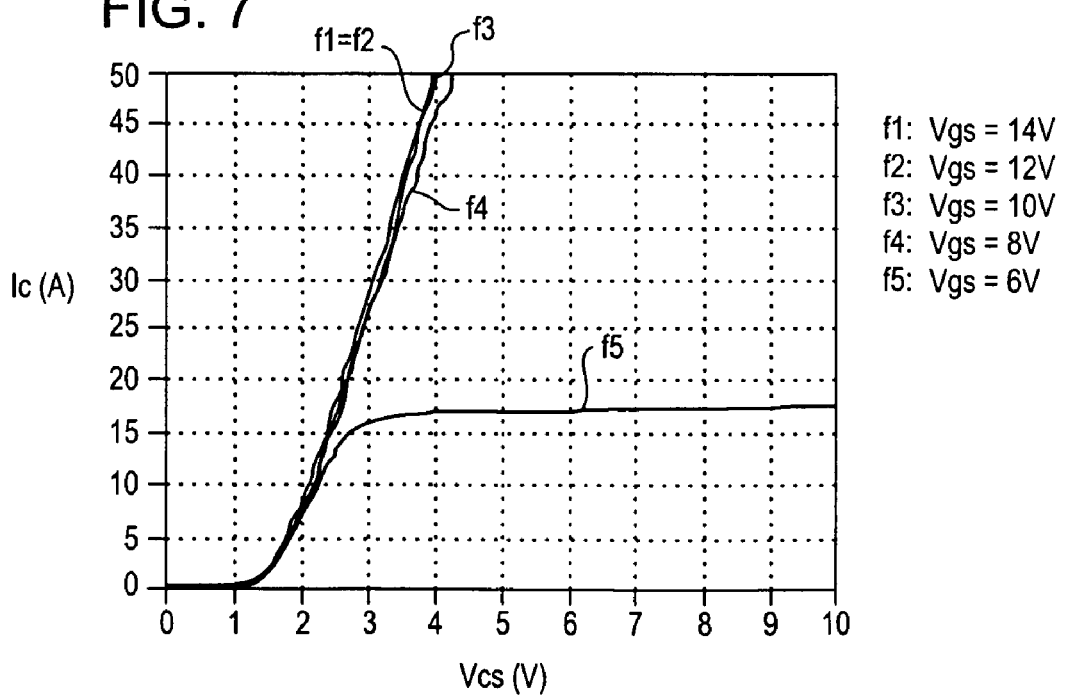
FIG. 7 shows the progress of waveforms obtained with the driving circuit shown in FIG. 6.

These disadvantages are evident from the pattern of the characteristic I-V of the driving circuit 20, shown in FIG. 7 for decreasing voltage values Vgs between the gate terminal G and the source terminal S (curves from f1 to f5).

Advantageously according to an embodiment of the invention, it has thus been thought to solve the above indicated problems with a compensation of the conduction threshold of the IGBT device 22, by making use of an additional D.C. supply, indicated with Va. The driving circuit according to an embodiment of the invention, shown in FIG. 8 and globally indicated at 30, is thus obtained.

As previously seen for the circuit of FIG. 6, the driving circuit 30 is connected to an emitter-switching configuration 21 so as to realize a device of the controlled emitter-switching type 35 having a collector terminal C, a source terminal S and a gate terminal G.

The emitter-switching configuration 21 comprises a cascode configuration of a bipolar transistor having a high breakdown voltage and of a low voltage power MOSFET transistor and it is inserted between the collector terminal C and the source terminal S. It also has a first X1 and a second control terminal X2, corresponding to the control terminals of the bipolar and MOSFET transistors, respectively, and connected to the driving circuit 30.

Advantageously according to an embodiment of the invention, the driving circuit 30 comprises an IGBT device 22 inserted between the collector terminal C and a first end, in particular negatively biased, of a capacitor C1, having in turn a second end, in particular positively biased, connected to the first control terminal X1 of the emitter-switching configuration 21. The IGBT device 22 has a third control terminal X3 connected, through a first resistive element R1, to the gate terminal G.

The driving circuit 30 also comprises a second resistive element R2 inserted between the gate terminal G and the second control terminal X2, as well as a first diode D1 inserted between the first end of the capacitor C1 and the source terminal S.

Advantageously, the driving circuit 30 comprises an additional supply Va inserted between the first and second ends of the capacitor C1. It is suitable to note that this additional supply Va is connected with opposite polarity with respect to the conduction voltage of the IGBT device 22 (according with the biasing of the capacitor C1), to use the benefits of its low conduction differential resistance and ensure a correct biasing of the capacitor C1 itself.

In this way, the driving circuit 30 obtains a control of the saturation condition of the bipolar transistor of the emitter-switching configuration 21, no longer through the adjustment of the current in the base-emitter loop, but through the maintenance of its base-collector junction at a voltage value next to zero. In particular, the control of the bipolar transistor of the emitter-switching configuration 21 occurs in the loop comprising it together with the IGBT device 22 and with the additional supply Va.

In this way, the voltage drop in conduction of the controlled emitter-switching device 35 thus obtained decreases to very low values, respecting the condition of almost saturation necessary for a steady storage time tstorage when the value of the collector current Ic of the device itself varies.

Figure 8:
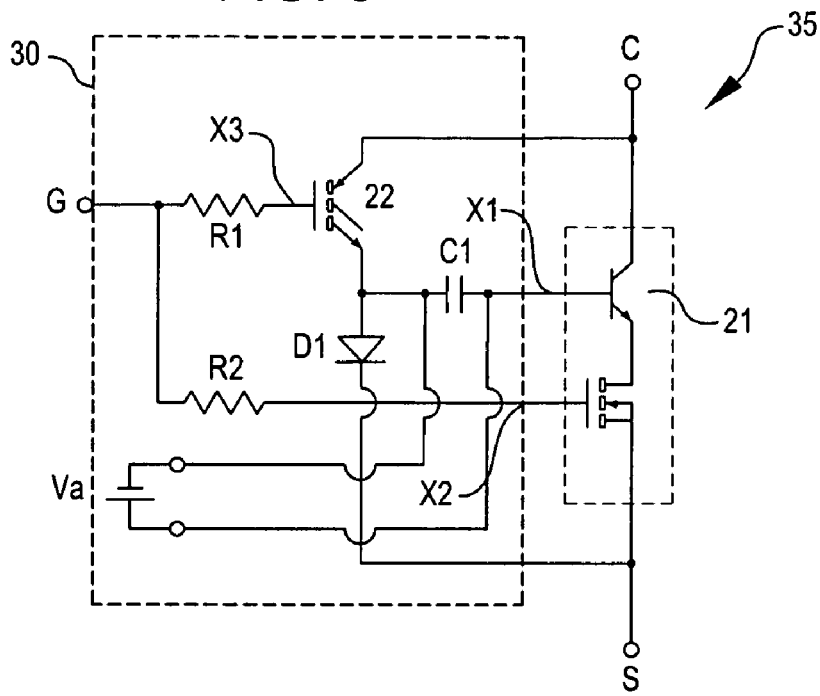
FIG. 8 schematically shows a driving circuit for an emitter-switching configuration realized according to an embodiment of the invention.
Figure 9:
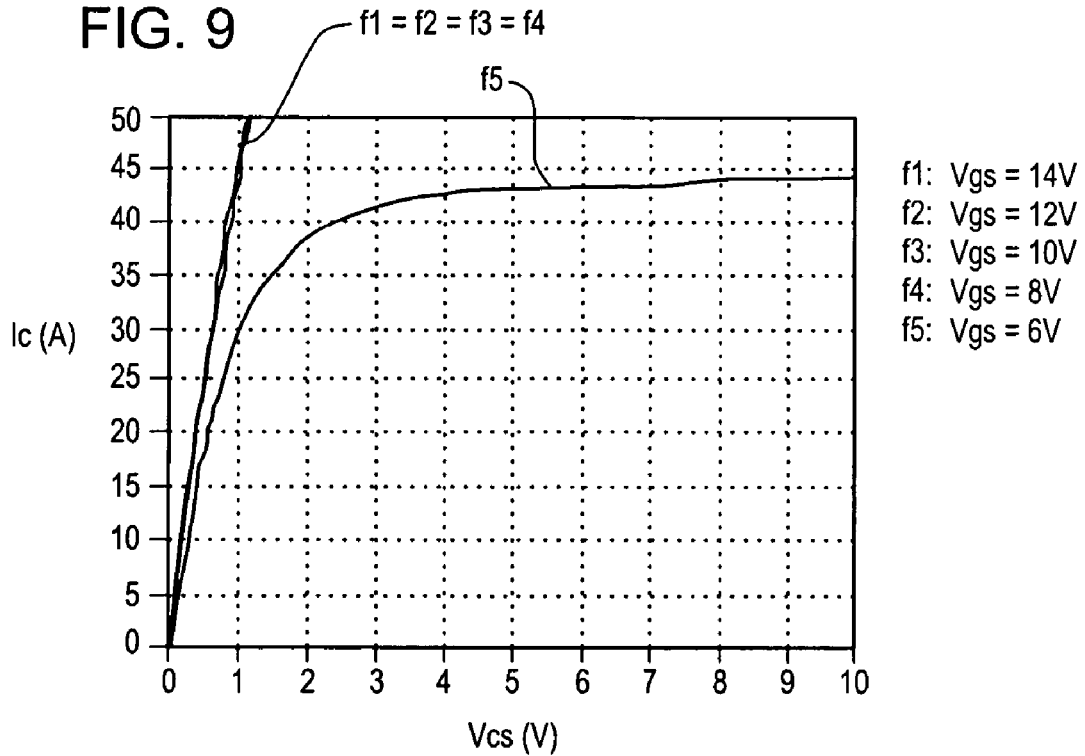
FIG. 9 shows a pattern of waveforms obtained with the driving circuit shown in FIG. 8.

The driving circuit 30 shown in FIG. 8 solves the problems above indicated in connection with the circuit of FIG. 6 and it attains several advantages among which:
    it is however easy to be driven
    it is MOSFET and IGBT compatible
    it allows the connection of a recirculation diode
    it has a low voltage drop in conduction
    it has a steady storage time tstorage when the collector current Ic varies
    it reduces the dynamic VCSsat in turn-on conditions with a collector current Ic>0
    it allows a partial recovery of the base energy during the switch-off condition
    it optimizes the security area RBSOA These advantages are evident from the pattern of the characteristic I-V of the driving circuit 30, shown in FIG. 9 for decreasing voltage values Vgs between gate terminal G and source terminal S (curves from f1 to f5, corresponding to the voltage values Vgs used for the characteristics shown in FIG. 7).

All the above listed advantages must be "paid" with the use of an additional supply Va.

Figure 10:
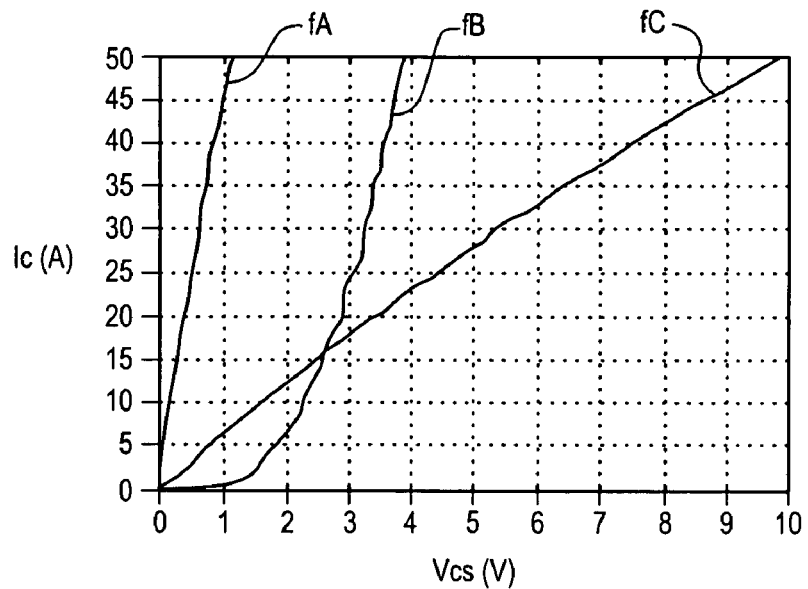
FIG. 10 shows, in comparison, a characteristic of the driving circuit shown in FIG. 8 and the characteristics of known electronic components, respectively IGBT and MOS.

In FIG. 10 the characteristics I-V of a high voltage MOS transistor (in particular of 1000V-curve fC), of a fast IGBT device (in particular of 1200V-curve fB) and of the controlled emitter-switching device 35 (curve fA) have been represented in comparison.

From this comparison the potentialities obtained with the driving circuit 30 according to an embodiment of the invention are evident.

In particular, it is noted how the driving circuit 30 according to an embodiment of the invention obtains very low losses in conduction, although offering switch speeds being comparable with a MOS transistor and being much better with respect to an IGBT device.

It is suitable to remark the fact that the operation principle of the driving circuit 30 according to an embodiment of the invention is based on the use of the properties of almost saturation of the bipolar transistor of the emitter-switching configuration 21.

In particular, by maintaining the base-collector voltage always below its direct biasing, never reaching the inverted biasing, the driving circuit 30 obtains a continuous control of the base current Ib instant by instant when the collector current Ic varies. The result is a storage time tstorage being really steady under all conditions, as shown by the experimental tests carried out, whose results are shown in FIGS. 11A-11C.

Figure 11A:
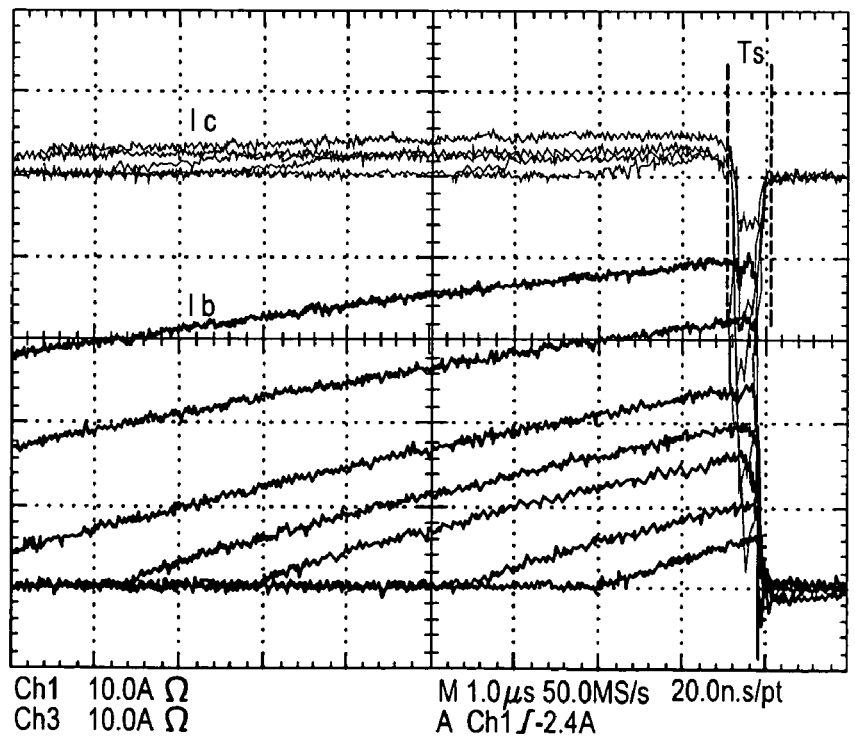
FIGS. 11A-11C show a pattern of waveforms obtained with the driving circuit of FIG. 8.

In particular, as FIG. 11A shows, during the conduction of the controlled emitter-switching device 35, the path of the current of the IGBT device 22 is obliged through the base of the bipolar transistor of the emitter-switching configuration 21, since the potential of the anode of the diode D1 (equal to +1V) is higher with respect to the potential VC1 of the first end (negative electrode) of the capacitor C1 (equal to −1.5V with respect to a ground value, since VCI=−Va+Vbe+Vds, being Va the supplemental voltage applied, Vbe the base-emitter voltage of the bipolar transistor and Vds the drain-source voltage of the MOS transistor of the emitter-switching configuration 21).

During the switch in the turn-off condition, after a simultaneous turn-off of the MOS transistor of the emitter-switching configuration 21 and of the IGBT device 22, for all the storage time tstorage the turn-off base current IBoff flows through the capacitor C1 (in this way charging it and thus allowing a partial recovery of the driving energy) and then it closes by means of the diode D1 on the source terminal S, normally to ground.

Figure 11B:
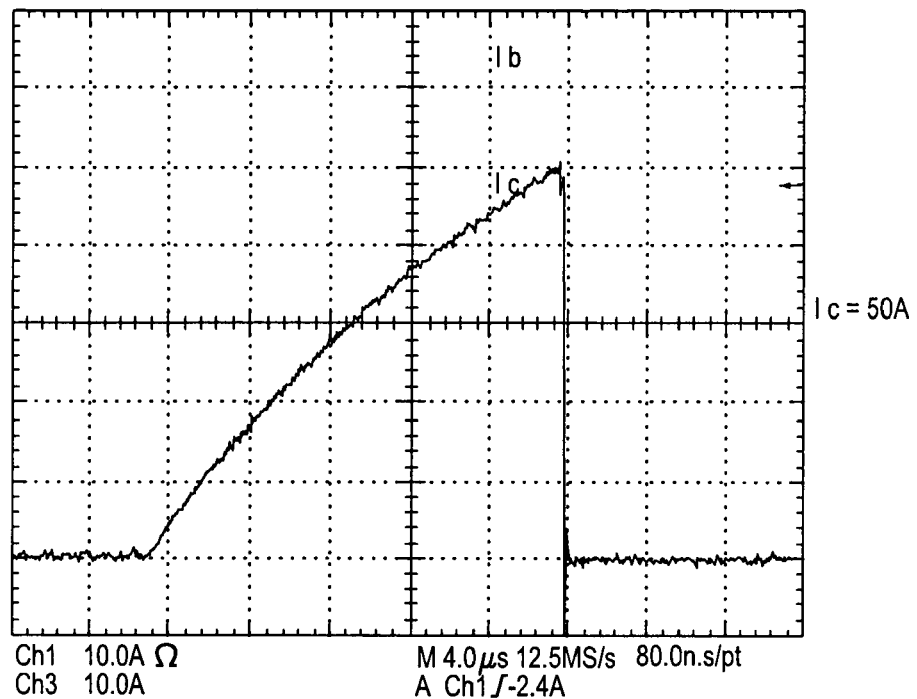
Figure 11C:
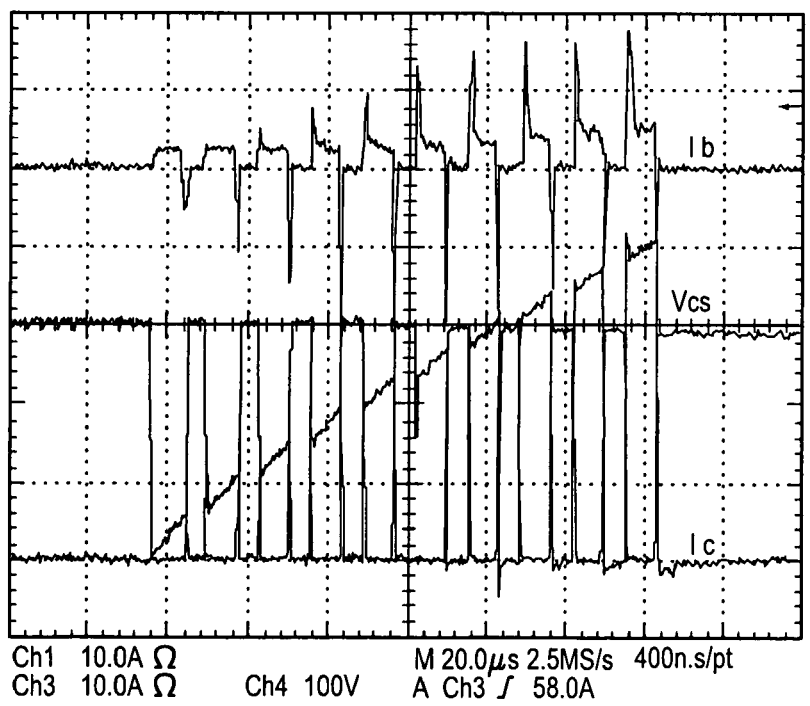

It is also possible to verify that the base current Ib of the controlled emitter-switching device 35 comprising the driving circuit 30 according to an embodiment of the invention increases in a non linear way with respect to the increasing of the collector current Ic, as shown in FIG. 11B.

In particular, it is verified that the base current Ib follows the Hfe of the bipolar transistor of the emitter-switching configuration 21 which, when the collector current Ic increases, decreases. Then, in order to maintain the condition of near saturation of the bipolar transistor, the base current Ib generated by the driving circuit 30 according to an embodiment of the invention should increase with a higher and higher di/dt, adapting to the variations of Hfe of the bipolar transistor of the controlled emitter-switching device 35.

A further example of how the driving circuit 30 adapts to all the working conditions occurs in case of repeated turns-on when the collector current Ic is non null and has a variable value. In this case, in fact, the base current Ib, besides modulating to follow the various situations, also provides initial peaks which allow the device to quickly reach the near saturation (reduction of the VCSsat dynamic), as schematically shown in FIG. 11C.

Figure 12:
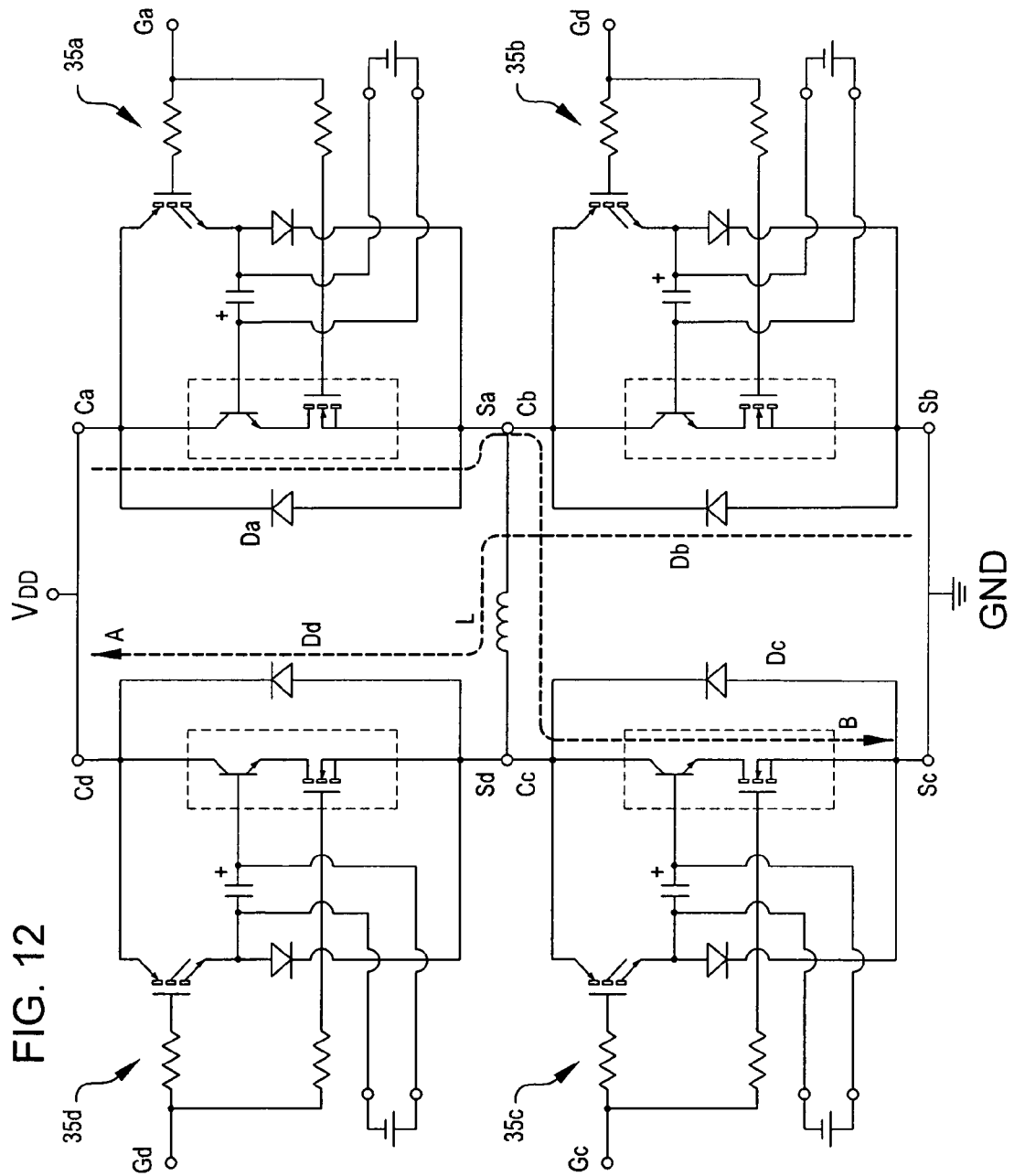
FIG. 12 schematically shows a complete bridge configuration comprising driving circuits of the type shown in FIG. 8.

In conclusion, it is suitable to remark the fact that the controlled emitter-switching device 35 comprising the driving circuit 30 according to an embodiment of the invention has a useful application in a complete bridge configuration having recirculation diodes connected to an inductive load, as schematically shown in FIG. 12.

In particular, the complete bridge configuration comprises four controlled emitter-switching devices 35a-35d having collector and source terminals connected to each other by respective recirculation diodes Da-Dd.

Differently from some known solutions, where there is always a supply capacitor between the base terminal and the ground reference which allows the passage of current in the base-collector junction of the bipolar transistor of the emitter-switching configuration, in the complete bridge configuration comprising driving circuits according to an embodiment of the invention the only path allowed for the recirculation of the inductive current is through the recirculation diodes Dd and Db connected to the collector Cd and source Sb terminals (as indicated in FIG. 12 by the arrow A). Similarly, when the bridge is closed, the current circulates through the diodes Da and Dc connected between the collector Ca and source Sc terminals (as indicated in FIG. 12 by the arrow B).

In conclusion, the driving circuit according to an embodiment of the present invention allows both to control the saturation level of a bipolar transistor of an emitter-switching configuration in applications having collector currents variable in a wide range, attaining in the meantime several advantages, among which the MOSFET and IGBT compatibility, an unusual structural simplicity which however allows the connection of a recirculation diode and a low voltage drop in conduction. The driving circuit according to an embodiment of the invention also ensures a steady storage time tstorage when the collector current varies and a reduction of the dynamic VCSsat with a partial recovery of the base energy during the turn-off condition.

Advantageously according to an embodiment of the invention, the driving circuit 30 controls the emitter-switching configuration 21 in almost saturation and makes it possible the use of the recirculation diode.

The circuit 35 of FIG. 8 may be part of an integrated circuit (IC), such as a motor controller, which may be part of a system, such as a disk drive. In the system, the IC may be connected to another IC, such as a processor or controller.

The invention claimed is:

1. A driving circuit for an emitter- switching configuration of transistors having at least one first and one second control terminal connected to said driving circuit to form a controlled emitter-switching device having in turn respective collector, source and gate terminals, at least one IGBT device inserted between said collector terminal and a first end of a capacitor, whose second end is connected to said first control terminal, said IGBT device having in turn a third control terminal connected, through a first resistive element, to said gate terminal, as well as a second resistive element inserted between said gate terminal and said second control terminal, and an additional supply inserted between said first and second ends of said capacitor to ensure its correct biasing.

2. The driving circuit according to claim 1, wherein said additional supply is connected with opposite polarity with respect to a conduction voltage of said IGBT device.

3. The driving circuit according to claim 1, wherein said first end of said capacitor is negatively biased and said second end of said capacitor is positively biased.

4. Driving circuit for an emitter-switching configuration of transistors having at least one first and one second control terminal connected to said driving circuit to form a controlled emitter-switching device having in turn respective collector, source and gate terminals, at least one IGBT device inserted between said collector terminal and a first end of a capacitor, whose second end is connected to said first control terminal, said IGBT device having in turn a third control terminal connected, through a first resistive element, to said gate terminal, as well as a second resistive element inserted between said gate terminal and said second control terminal, and an additional supply inserted between said first and second ends of said capacitor to ensure its correct biasing, wherein further comprising at least one diode inserted between said first end of said capacitor and said source terminal.

5. A switch controller, comprising:
  first and second controller conduction nodes operable to be respectively coupled to first and second switch conduction nodes of a switch to be controlled;
  an input controller control node;
  a first output controller control node operable to be coupled to a first switch control node of the switch to be controlled;
  an insulated-gate transistor having a control node coupled to the input controller control node, a first conduction node coupled to the first controller conduction node, and a second conduction node coupled to the first output controller control node and to the second controller conduction node;
  a capacitor coupled between the second conduction node of the insulated-gate transistor and the first output controller control node; and
  a bias-voltage generator coupled across the capacitor.

6. The switch controller of claim 5 wherein the insulated-gate transistor comprises an insulated-gate bipolar transistor.

7. The switch controller of claim 5 wherein the insulated-gate transistor comprises a MOS transistor.

8. The switch controller of claim 5, further comprising an impedance element coupled between the input controller control node and the control node of the insulated-gate transistor.

9. The switch controller of claim 5, further comprising a capacitor coupled between the second conduction node of the insulated-gate transistor and the first output controller control node.

10. The switch controller of claim 5, further comprising a diode coupled between the second conduction node of the transistor and the second controller conduction node.

11. The switch controller of claim 5, further comprising a pair of diodes serially coupled between the second conduction node of the transistor and the second controller conduction node.

12. A switch controller, comprising:
  first and second controller conduction nodes operable to be respectively coupled to first and second switch conduction nodes of a switch to be controlled;
  an input controller control node;
  a first output controller control node operable to be coupled to a first switch control node of the switch to be controlled;
  an insulated-gate transistor having a control node coupled to the input controller control node, a first conduction node coupled to the first controller conduction node, and a second conduction node coupled to the first output controller control node and to the second controller conduction node;
  a capacitor coupled between the second conduction node of the insulated-gate transistor and the first output controller control node;
  a bias-voltage generator coupled across the capacitor;
  a second output controller control node operable to be coupled to a second switch control node of the switch to be controlled; and
  an impedance element coupled between the input controller control node and the second output controller control node.

13. A method, comprising:
  deactivating an insulated-gate first transistor;
  deactivating an insulated-gate second transistor;
  deactivating a bipolar third transistor in response to deactivating the first and second transistors;
  generating a bias voltage across a capacitor that is coupled between a conduction node of at least one of the first and second transistors and a base of the third transistor; and
  conducting a turn-off current from the base of the third transistor through the capacitor.

14. The method of claim 13 wherein deactivating the first and second transistors comprises deactivating the first and second transistors in response to a control signal.

15. The method of claim 13 wherein deactivating the first and second transistors comprises deactivating the first and second transistors substantially simultaneously.

16. The method of claim 13 wherein conducting the turn-off current comprises conducting the turn-off current through a diode.

17. A method, comprising:
  deactivating an insulated-gate first transistor;
  deactivating an insulated-gate second transistor;
  deactivating a bipolar third transistor in response to deactivating the first and second transistors;
  generating a bias voltage across a capacitor that is coupled between a conduction node of at least one of the first and second transistors and a base of the third transistor;
  conducting a turn-off current from the base of the third transistor through the capacitor;
  activating the insulated-gate first transistor;
  activating the insulated-gate second transistor; and
  activating the bipolar third transistor in response to activating the first transistor and with charge stored in the capacitor from the turn-off current.

\* \* \* \* \*